United States Patent [19]

Hertz et al.

[11] 4,348,735
[45] Sep. 7, 1982

[54] CYCLOTOMIC TONE DETECTOR AND LOCATOR

[75] Inventors: David Hertz, Akko, Israel; Robert P. Kurshan, New York, N.Y.; David Malah, Kiryat-Bialik, Israel

[73] Assignee: Bell Telephone Laboratories, Incorporated, Murray Hill, N.J.

[21] Appl. No.: 162,262

[22] Filed: Jun. 23, 1980

[51] Int. Cl.³ .............................................. G06F 15/31
[52] U.S. Cl. ................................................... 364/724
[58] Field of Search ........................ 364/724, 825, 572; 328/67

[56] References Cited

U.S. PATENT DOCUMENTS

| | | | |
|---|---|---|---|
| 3,963,905 | 6/1976 | Gopinath et al. | 364/717 |
| 4,106,102 | 8/1978 | Desblache | 364/724 |
| 4,191,853 | 3/1980 | Piesinger | 364/724 X |

OTHER PUBLICATIONS

Kurshan et al., "Digital Single Tone Generator-Detectors", *The Bell System Tech. J.*, Apr., 1976, pp. 469–496.
Cappellini, "Digital Filtering with Sampled Signal Spectrum Frequency Shift", *Proceedings of the IEEE*, Feb. '69, pp. 241–242.
Cappellini et al., "A Special-Purpose On-Line Processor for Bandpass Analysis", *IEEE Trans. on Audio & Electroacoustics*, Jun. 1970, pp. 188–194.

*Primary Examiner*—David H. Malzahn
*Attorney, Agent, or Firm*—R. O. Nimtz

[57] ABSTRACT

A system (1000) for estimating the frequency of a tone input utilizes sample rate reduction in successive stages and processing by digital cyclotomic filters at each stage. The tone input (2001) is first transformed in network (1100) to yield two quadrature tones. Digitizer (1200) converts the two tones into data words. Buffer (1300) comprises two essentially identical storage arrangments wherein data words are stored and then supplied to succeeding stages. Frequency-shifting unit (1400) effects modulus-one multiplication by processing appropriately selected data words. Word pairs and frequency-shifted versions thereof are processed by cyclotomic filters (1500). Sequential decimation in the system effects a successively refined estimate to the tonal frequency. During each stage of decimation, the filters are configured to provide symmetric coverage of the subband containing the estimate. Configuration information is provided by decision unit (1600) via threshold comparison of the outputs from the filters and controller (1700) provides control information to the elements of the system. Rate reduction occurs on a 4:1 basis for each stage of decimation. The first frequency interval covered is one-fourth the initial sampling rate, and each stage of decimation causes a factor of four refinement in the estimate. The filters are structured as the equivalent of four filter pairs at each stage of decimation; two of the four pairs are of first order, whereas the other two are of second order.

7 Claims, 16 Drawing Figures

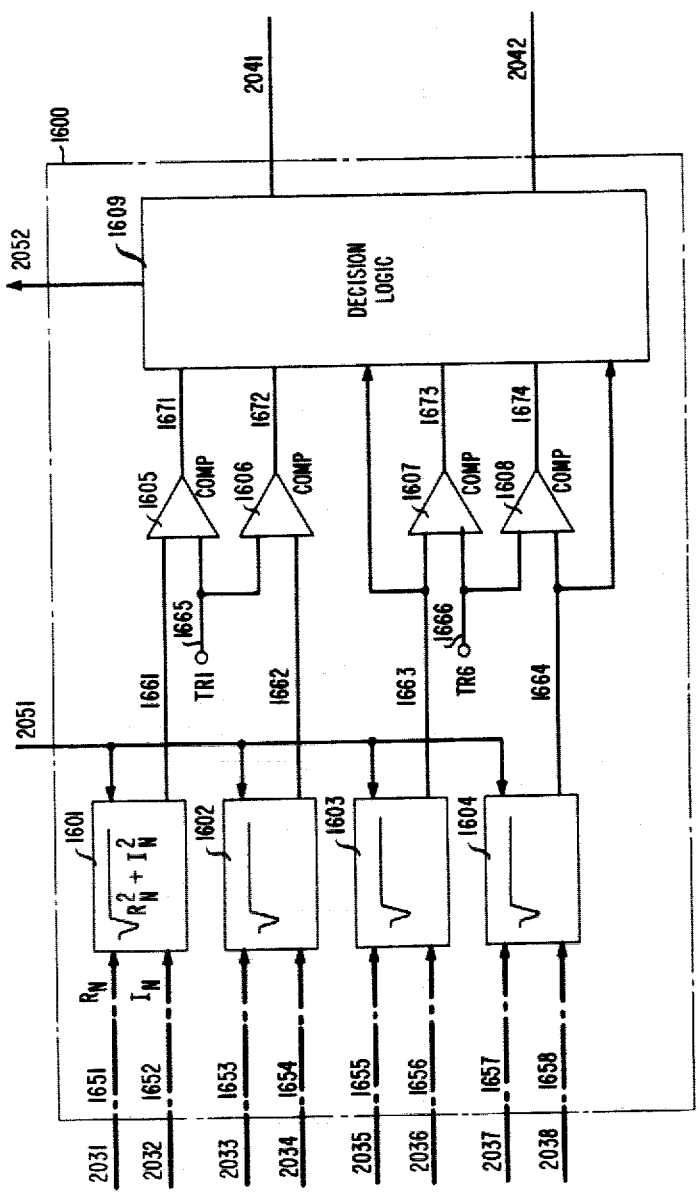

CYCLOTOMIC TONE DETECTOR AND LOCATOR

BACKGROUND OF THE INVENTION

1. Field of the Invention

This invention relates generally to spectrum analysis and, more particularly, to tone detection by discrete-time filtering.

2. Description of the Prior Art

In many diverse applications, it is necessary to detect the presence of a signal within selected frequency bands and, particularly for a signal comprising a single tone, to estimate the frequency of the tone which may appear randomly in any band. This detection and estimation is generally accomplished in conventional analog systems by utilizing a bank of filters tuned to different, narrow-band portions of the spectrum or by employing a single filter which is effectively swept across the bands of interest. Associated with such techniques, however, are the usual problems of analog processors, including unpredictability due to inherent variability of system components.

A discrete-time technique for partitioning the given frequency bands into subbands for detection purposes is described in companion references. The first is a letter by V. Cappellini entitled "Digital Filtering With Sampled Signal Spectrum Frequency Shift", published in the *Proceedings of the IEEE*, February, 1969, pages 241 and 242. The other reference is an article by V. Cappellini et al entitled "A Special-Purpose On-Line Processor for Bandpass Analysis," appearing in the *IEEE Transactions on Audio and Electroacoustics*, June, 1970, pages 188-194. In accordance with the technique of the references, the input signal (bandlimited to $\omega_m$) is sampled at the frequency $2\omega_m$ so as to alias the portion of the baseband from $-\omega_m$ to 0 into the band $\omega_m$ to $2\omega_m$ and the sampled signal is processed in two parallel paths. In one path, the sampled signal is filtered with a time-shared, low-pass filter having an initial cutoff frequency of $\omega_m/2$, thereby developing a signal representation of the input signal's spectrum from 0 to $\omega_m/2$. In the other path, the sampled signal is shifted in frequency by $\omega_m$ by multiplying the elements of the sampled sequence by $(-1)^n$, and the shifted signal is filtered with the same low-pass filter, thereby developing a signal representation of the input signal's spectrum from $\omega_m/2$ to $\omega_m$. In this manner, the digital signals at the output of the two paths are now bandlimited to $\omega_m/2$. By reducing the sampling rate or decimating by a factor of 2, this approach can be reapplied to each of the two developed signals to obtain four signals, with each output signal now representing a different quarter of the spectrum of the input signal. In this fashion, with an increased number of decimation stages and time-sharing of a single digital filter, successively narrower bands can be evaulated. Thus, the main advantage of this decimation approach for partitioning a given frequency band into several subbands is that a single, fixed low-pass digital filter is required; bandpass analysis can be achieved efficiently with a unique digital filter having fixed coefficients at each stage of decimation.

In a variety of applications, it is known that the spectrum of interest contains, at most, a single spectral line since the input signal is a tone. When this a priori condition is known to exist, the method of Cappellini et al possesses inherent disadvantages. Since general filtering is effected at each decimation stage, numerous multiplications and additions must be performed during the filtering operations of each stage. Another disadvantage is the numerous memory locations required to store samples from the geometrically increasing number of iterated signals.

SUMMARY OF THE INVENTION

The above disadvantages of prior art systems as well as other shortcomings and limitations are obviated with the present invention of a combined analog-digital tone detection system incorporating digital cyclotomic filters of only first and second order. These filters eliminate the necessity of multiplications during filtering, thereby reducing computation load at each stage of decimation.

In accordance with the circuitry and associated methodology of the present invention, the input tone, comprising a cosinusoidal signal having a frequency located randomly within the band 0 to $f_s/4$ Hz ($f_s$ is the initial sampling rate), is transformed to obtain two tones. One tone is an in-phase tone corresponding to a phase-shifted version of the input tone and the other is a tone in quadrature with the in-phase tone, generally obtained via a Hilbert transform operation on the in-phase tone. The in-phase and quadrature tones are both sampled at the rate $f_s$ Hz to provide a sequence of real and imaginary words grouped as word pairs. A memory buffer, comprising two essentially identical storage arrangements, accepts and stores the word pairs. While one arrangement provides input information to succeeding processing stages, the other storage arrangement is being loaded, and vice versa. The word pairs undergoing processing by succeeding stages are frequency-shifted via a modulus-one multiplication operation on the word pairs. The multiplication is accomplished by interchanging real words with imaginary words and vice versa, when required, as well as changing the signs associated with the words, also when required. Both sets of word pairs, that is, real and imaginary and frequency-shifted versions thereof, serve as the input to an array of cyclotomic filters. Four pairs of filters are utilized at each stage of decimation, two of these pairs being first order and the remaining two being second order. One filter from each of the four pairs processes real words whereas the other processes imaginary words. Actual filtering may be either on a time-shared basis or with separately identifiable filters. At each stage of decimation, the filters are arranged so that their combined frequency domain characteristics cover the band of frequencies containing the tone in symmetric fashion. The portion of the frequency spectrum to be searched at the next stage of decimation is obtained by generating the modulus of each of the four filter outputs and comparing each said modulus to preselected thresholds after a predetermined number of samples have been processed at each decimation stage. A main controller generates logic and synchronizing signals to effect decimation and configuration of the array of filters in response to the result of the comparison operations. Sample rate reduction occurs in a ratio of four-to-one. Thus, after the first stage of decimation, the tone is located to within frequency subbands of width $f_s/4$. The second stage results in a refined estimate of width $f_s/16$. The decimation and refinements continue in this manner until the desired resolution has been achieved.

Brief Description of the Drawing

FIG. 16 is a diagram, partly in block form and partially in schematic, depicting one form of the decision unit from FIG. 9.

DETAILED DESCRIPTION

Figure 1:
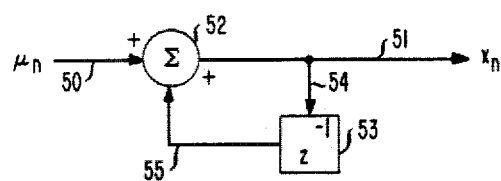
FIG. 1 depicts cyclotomic digital filter $C_1$, considered as exemplary of the cylcotomic filters of interest, in block diagram form.

For clarity of exposition, it is helpful to first provide an overview of the properties of cyclotomic filters, particularly the first- and second-order filters utilized in the illustrative embodiment. Next, a detailed discussion of the time and frequency domain characteristics of one first-order filter (designated $C_1$), and one second-order filter (designated $C_3$), both treated as exemplary of the remaining filters of interest (designated $C_2$ and $C_6$), is presented to illustrate foundational concepts helpful to fully comprehend the overall tone detection system. Finally, the technique for exploiting the properties of the individual filters to form a composite tone detection system is elucidated.

1. Cyclotomic Filters

The properties discussed herein are presented in greater detail in U.S. Pat. No. 3,963,905, issued to Gopinath et al on June 15, 1976, as well as a paper entitled "Digital Single-Tone Generator-Detectors," by R. P. Kurshan and B. Gopinath, published in the *Bell System Technical Journal*, April, 1976, pages 469-496. The full disclosures of these references are incorporated herein by reference. However, sufficient detail is extracted from these references to ensure an understanding of and insight into the present invention.

Cyclotomic filters are a class of digital filters having only poles in the transfer function and, moreover, each pole lies on the unit circle in the z-transform domain. This means that the filters are inherently unstable and are not suitable for conventional filtering operations which require the processing of numerous contiguous samples. In fact, these filters behave more like resonators and it is this property that can be beneficially utilized for tone detection. The salient advantage of this type of resonating filter is that the filters of primary interest have coefficient values from the set $(-1,0,1)$. This implies that multiplications of samples by filter coefficients reduce to simple addition and subtraction operations and, significantly, arithmetic errors such as round-off and truncation errors are eliminated.

A cyclotomic filter may be described in terms of a linear recursion relation whose characteristic polynomial is a cyclotomic polynomial. For example, for a first order digital filter represented by the linear difference equation (LDE)

$$x_n = x_{n-1} + \mu_n,$$

where $\mu_n$ and $x_n$ are input and output sequence elements corresponding to the $n^{th}$ sample, the characteristic equation is given by the polynomial $\lambda-1$ (as derived from $x_n - x_{n-1} = 0$). This polynomial is cyclotomic and has the designation $C_1(\lambda)$ (or $C_1$ for simplicity): $C_1(\lambda) = \lambda - 1$. Similarly, the cyclotomic polynomial $C_2(\lambda) = \lambda + 1$ yields a digital filter described by the LDE $$x_n = -x_{n-1} = n.$$

Other filters or special interest include but are not limited to, $C_3(\lambda) = \lambda^2\lambda + 1$ and $C_6(\lambda) = \lambda^2 - \lambda + 1$, which are of second order and have the following LDE representations, respectively:

$$x_n = -x_{n-1} - x_{n-2} + \mu_n$$

and $$x_n = x_{n-1} - x_{n-2} + \mu_n.$$

FIG. 1 depicts the $C_1$ digital filter in block diagram form. The input and output sequence elements $\|_n$ and $x_n$ appear on lines 50 and 51, respectively. The output, via lead 54, is also fed back to adder 52 via unit delay device 53 and lead 55. Similar block diagrams obtain for the other cyclotomic filters and the Gopinath et al. patent discloses a general filter structure for an $1^{th}$ order cyclotomic filter.

2. Filter Characteristics

To elucidate the desired characteristics obtained by combining cyclotomic filters into a system architecture, the response of a general filter to an input tone having a randomly distributed phase component must first be presented. The input tone is presumed to have the analog form $A\cos(2\pi ft + \phi)$, where $\phi$ is the phase random variable, A is the amplitude and f is the tone frequency.

The impulse response sequence of the general cyclotomic filter is represented by $\{h_k\}$, where $k \geq 0$. The output sequence elements may then be obtained from the convolutional relationship (which is one technique for representing the solution to an LDE)

$$x_n = \sum_{k=0}^{n} \mu_k h_{n-k}. \tag{1}$$

where $\{\mu_k\}$ is the input tone sequence obtained by sampling $A\cos(2\pi ft+\phi)$, $t \geq 0$, at the rate $f_s$ Hz, that is, $$\mu_k = A\cos(k\theta + \phi),$$

where $\theta = 2\pi f/f_s$.

The solution to equation (1) has the form $$x_n = \sqrt{\alpha_n^2 + \beta_n^2} \sin\left[\tan^{-1}\left(\frac{\alpha_n}{\beta_n}\right) - \phi\right], \tag{2}$$

where $$\alpha_n = Re\left[\sum_{k=0}^{m} Ae^{jk\theta} h_{n-k}\right], \tag{3}$$

$$\beta_n = Imag\left[\sum_{k=0}^{n} Ae^{jk\theta} h_{n-k}\right], \tag{4}$$

and the operators denoted "Re" and "Imag" produce the real and imaginary parts of the bracketed part of equations (3) and (4), respectively.

Since $\phi$ occurs randomly within the interval $(0, 2\pi)$ radians, comparison of $|x_n|$ to a threshold may yield deleterious results due to the dependency of $x_n$ on $\phi$. However, by utilizing the cyclotomic filters in pairs (either actually or on a time-shared basis), the undesirable modulation effects of the random phase component may be eliminated.

This is achieved by forming a new sample sequence $\{\delta_k\}$ found by sampling the quadrature tone $A\sin(2\pi ft + \phi)$, which may be derived though a Hilbert transform operation on the original or in-phase input tone. The new sequence elements are given by $$\delta_k = A\sin(k\theta + \phi), \; k > 0.$$

If $\{\delta_k\}$ is processed by a cyclotomic filter identical to the one which processes $\mu_k$, then the new output sequence $\{y_n\}$ has elements $$y_n = \sqrt{\alpha_n^2 + \beta_n^2} \cos\left[\tan^{-1}\left(\frac{\alpha_n}{\beta_n}\right) - \phi\right]. \tag{5}$$

A squaring operation on both equations (2) and (5), followed by a summation and square-root operation yields an output $$\sqrt{\alpha_n^2 + \beta_n^2}$$

which is independent of $\phi$.

For future discussion, it is convenient, as exemplified by the form of equations (3) and (4), to define a complex input tone having sample values $Ae^{j(k\theta+\phi)}$ and a corresponding output sequence $\{z_n\}$ having complex element values $$z_n = \sum_{k=0}^{n} Ae^{j(k\theta+\phi)} h_{n-k}. \tag{6}$$

The magnitude or modulus of each element of $\{z_n\}$ is then given by $$|z_n| = \left|\sum_{k=0}^{n} Ae^{jk\theta} h_{n-k}\right| = \sqrt{\alpha_n^2 + \beta_n^2}. \tag{7}$$

As hereinafter utilized, the two-filter device characterized by substantially identical filters $C_i$ ($i = 1, 2, 3$ or $6$), which processes in-phase and quadrature samples of an input signal in pairs, is a basic or foundational element of the tone detection system.

Whereas the above discussion has focused primarily on sequence domain manipulations, it is helpful to visualize these manipulations in the frequency domain. Moreover, whereas the discussion was couched in terms of generalized impulse responses, particularly pertinent to the subsequent discussion are the frequency domain responses of filters $C_1$, $C_2$, $C_3$ and $C_6$. $C_1$, having impulse elements $h_n = 1$, $n \geq 0$, is treated as exemplary.

Utilizing now the notation $z(C_1, n, \theta)$ to distinguish sequence elements of $\{z_n\}$ so as to explicitly set forth the dependence upon $C_1$, n and $\theta$, the following obtains by substituting $h_n = 1$ into equation (7):

$$|z(C_1, n, \theta)| = A\left|\sum_{k=0}^{n} e^{jk\theta}(1)\right| \tag{8}$$

or $$|z(C_1, n, \theta)| = A\left|\frac{\sin\left(\frac{n+1}{2}\right)\theta}{\sin\frac{\theta}{2}}\right|. \tag{9}$$

In addition, $$|z(C_2, n, \theta)| = |z(C_1, n, \theta + \pi)|. \tag{10}$$

Figure 2:
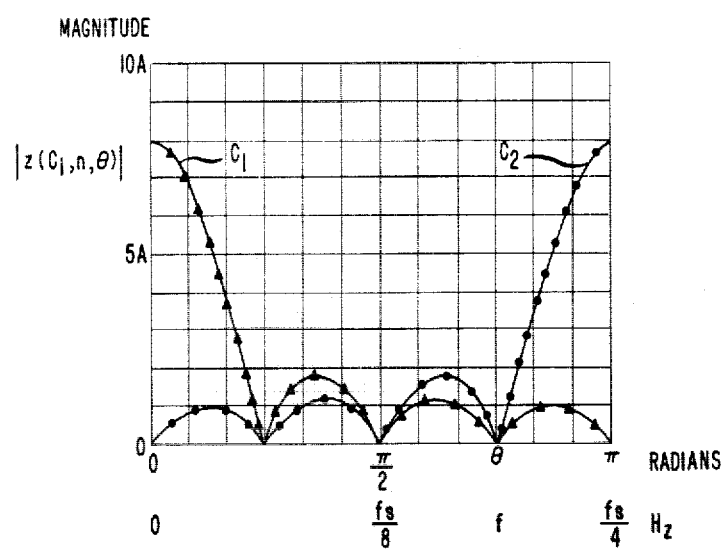
FIG. 2 shows the responses from filter pair $C_1$ and filter pair $C_2$, each processing real and imaginary sampled tones in parallel, over the range from 0 to one-quarter of the sampling rate.

FIG. 2 shows plots of $|z(C_1, n, \theta)|$ and $|z(C_2, n, \theta)|$ over the range (O to $\pi$) radians for $n = 7$, that is, eight samples corresponding to $n = 0, 1, \ldots, 7$ have been processed. The resonating feature of the filters is apparent. Filter $C_1$ is symmetric with respect to $\theta = 0$, whereas $C_2$ is symmetric about $\theta = \pi$, and both are periodic with period $2\pi$. Since $\theta = 2\pi f/f_s$, $\theta = \pi$ corresponds to a frequency f which is one-half the sampling rate.

In a similar manner, the following relations may also be derived:

$$|z(C_3, n, \theta)| = 2A\left|\frac{\sin\frac{\theta}{2}\sin\frac{3m}{2}\theta}{\sin\frac{3}{2}\theta}\right| \tag{11}$$

for $n = 3m$ or $3m - 1$, $m = 1, 2, \ldots$, or $$|z(C_3,n,\theta)| = 2A \left| e^{-j\frac{(3m-4)\theta}{2}} \cdot \frac{\sin\frac{\theta}{2} \sin\left(\frac{3m-4}{2}\right)\theta}{\sin\frac{3}{2}\theta} + 1 \right| \quad (12)$$

for $n=3m-2$, $m=1, 2, \ldots$ Also, because of the manner in which $C_6$ is related to $C_3$ $$|z(C_6,n,\theta)| = |z(C_3,n,\theta+\pi)|. \quad (13)$$

Figure 3:
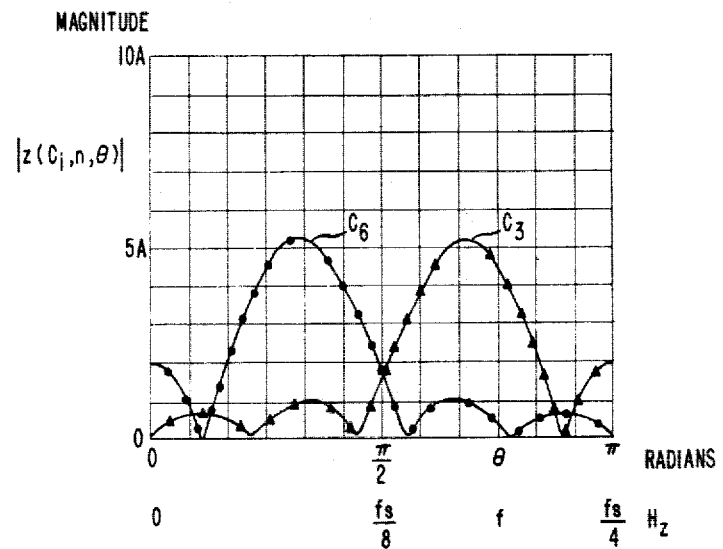
FIG. 3 shows the response from filter pairs $C_3$ and $C_6$ to the same scale and over the same range of frequency as in FIG. 2.

FIG. 3 shows plots of $|z(C_3,n,\theta)|$ and $|z(C_6,n,\theta)|$ for the same parameters as FIG. 2.

Figure 4:
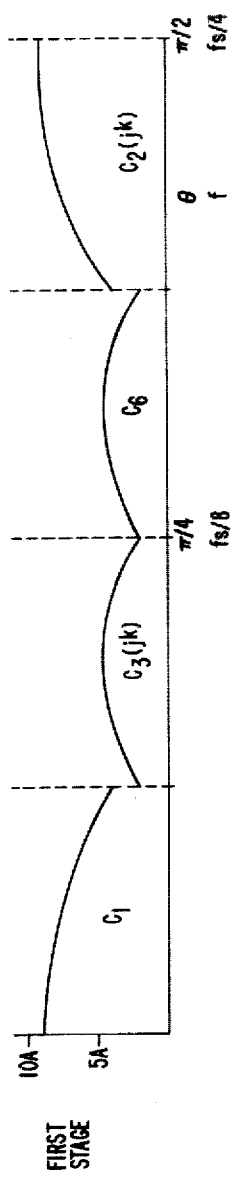
FIG. 4 depicts the arrangement of four cyclotomic filters which cover the frequency band from 0 to one-quarter of the sampling rate.

From the plots of FIGS. 2 and 3, it is concluded that the filter response from each two-filter device comprising identical filters $C_i$ ($i=1, 2, 3$, or $6$), have only a single resonance in the frequency range up to one-half of the sampling frequency. The cyclotomic tone detection system in accordance with the present invention expoits these filter pairs by covering the frequency band from 0 to $f_s/4$ ($\theta$ from O to $\pi/2$) in symmetric fashion. Such an arrangement is depicted in FIG. 4. In comparing FIGS. 2 and 3 with FIG. 4, it is clear that, whereas $C_1$ and $C_6$ remain in place with respect to $\theta$, in order to cover the band symmetrically, $C_2$ and $C_3$ are shifted by $-\pi/2$ radians. This $\pi/2$ frequency-shifting operation applied to $C_2$ and $C_3$ is denoted in FIG. 4 by $C_2(j^k)$ and $C_3(j^k)$, respectively.

Phase-shifting by $-\pi/2$ in the frequency domain is equivalent to introducing modulation factors in the sequence (sampled time) domain of the form $\{e^{jk\pi/2}\}$. Thus, if the complex input sequence is modified by the modulation sequence, a new sequence having element values $$Ae^{j(k(\theta+\pi/2)+\phi)} \quad (14)$$

gives rise to an output corresponding to $C_2(j^k)$ or $C_3(j^k)$, as appropriate. The in-phase and quadrature sequences associated with this complex input sequence become, respectively, $$A\cos(k\theta+\phi)\cos(k\pi/2) - A\sin(k\theta+\phi)\sin(k\pi/2) \quad (15)$$

and $$A\sin(k\theta+\phi)\cos(k\pi/2) + A\cos(k\theta+\phi)\sin(k\pi/2). \quad (16)$$

Since $k$ is an integer $\geq 0$, the shifted in-phase sequence reduces to a sequence which is periodic of period four having element values for $k=0, 1, 2$ and $3$ of (from equation (15)):

$$A\cos(k\theta+\phi); \; -A\sin(k\theta+\phi); \; -A\cos(k\theta+\phi);$$
$$A\sin(k\theta+\phi). \quad (17)$$

Similarly, the shifted quadrature sequence has elements for $k=0, 1, 2, 3$ (equation (16)) of:

$$A\sin(k\theta+\phi); \; A\cos(k\theta+\phi); \; -A\sin(k\theta+\phi);$$
$$-A\cos(k\theta+\phi). \quad (18)$$

Perusal of equations (17) and (18) results in the realization that the operation of phase-shifting by $\pi/2$, rather than occurring through frequency domain manipulations, may be straightforwardly implemented in the sequence or sample domain merely by interchanging and changing signs of the in-phase and quadrature inputs to a filter pair, when appropriate. Because of the form of equation (14), such an implementation may be referred to as a modulus-one multiplier or ($j^k$) frequency-shifter.

Figure 5:
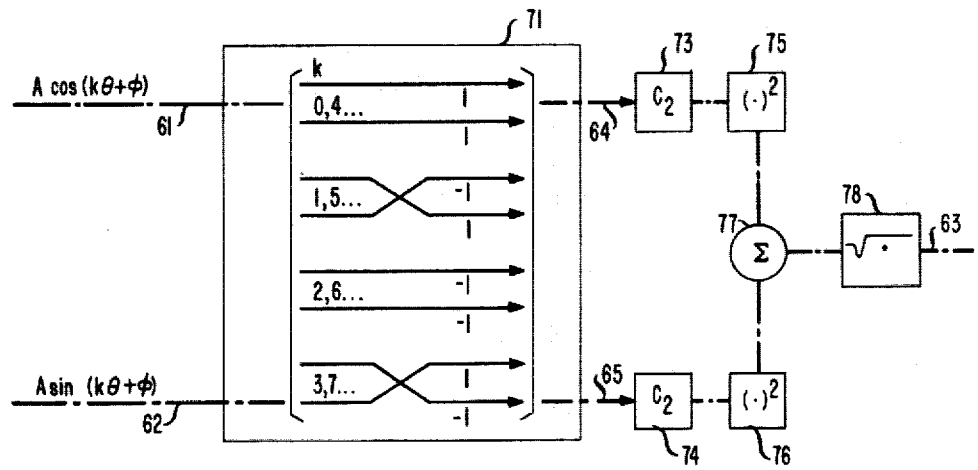
FIG. 5 shows a block diagram representation of a modulus-one multiplier or frequency-shifting device.

A block diagram representation of the modulus-one multiplier is shown in FIG. 5. Lines 61 and 62 provide the original in-phase and quadrature sequence elements to frequency-shift unit 71. The operations of sign changing and line interchanging occur within unit 71, as depicted for $k=0, 1, \ldots, 7, \ldots$ Lines 64 and 65 provide shifted in-phase and quadrature sequence elements, respectively, to two identical $C_2$ filters 73 and 74. After the separate squaring operations in devices 75 and 76, summing in device 77 and then square-rooting in device 78, line 63 provides the output having the shifted frequency response described above by $C_2(j^k)$. The operations of squaring, summing and square-rooting may be referred to variously as a magnitude or a modulus operation.

Figure 6:
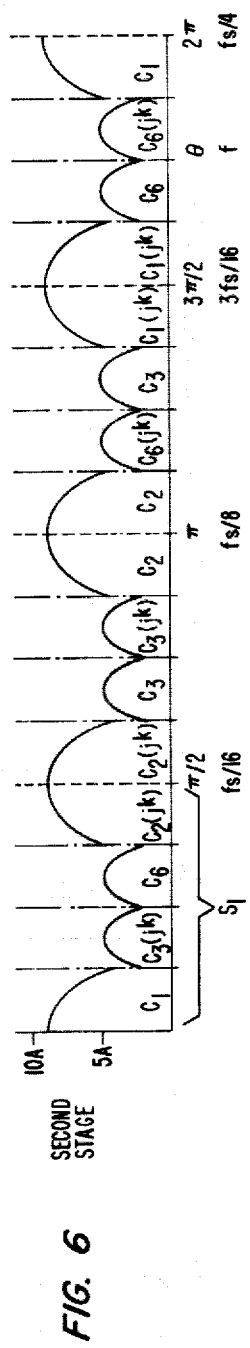
FIG. 6 depicts, on the same scale as FIG. 4, the arrangement of sixteen cyclotomic filters which cover the band from 0 to one-quarter of the initial sampling rate and are symmetric over the four subbands shown in FIG. 4.
Figure 7:
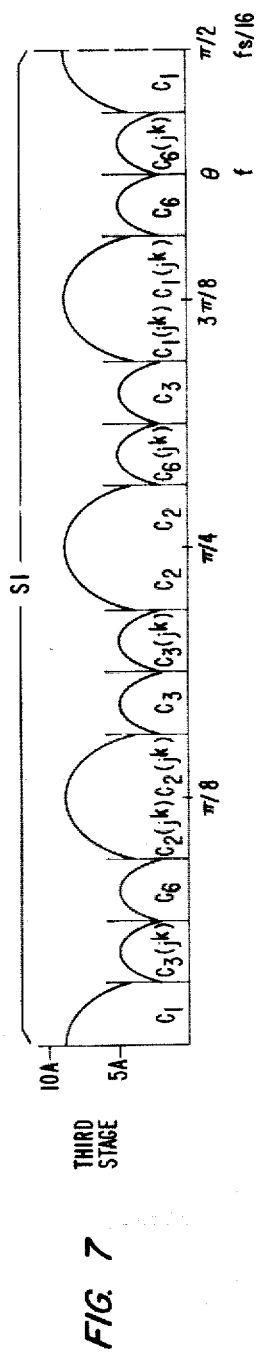
FIG. 7 depicts, on a scale expanded four times with respect to FIGS. 4 and 6, the same arrangement of sixteen filters as depicted in FIG. 6, this arrangement now covering each band of width $f_s/16$ Hz from FIG. 6.

FIGS. 6 and 7 depict how each of the four subbands of FIG. 4 may be further partitioned to isolate the tone of interest. Basically, the subbands are subdivided into second-stage subbands by reducing the sampling rate and reconfiguring the filter array within each subband of interest. For instance, the first stage subband labelled $C_6$ in FIG. 4 has been subdivided by reducing the sampling rate by a factor of 4 and covering the old subband by $C_2$, $C_6(j^k)$, $C_3$ and $C_1(j^k)$, which effects four second-stage subbands symmetrically dispersed across the original subband. Further sample rate reduction by a factor of four results in the partition of FIG. 7. By comparing FIGS. 6 and 7, it is demonstrated that groups of four second-stage subbands in FIG. 6 are covered by replicas of the sixteen second-stage subbands of FIG. 6, as depicted in FIG. 7 on an expanded scale. This configuration and covering occurs on each stage of decimation after the first stage.

Figure 8:
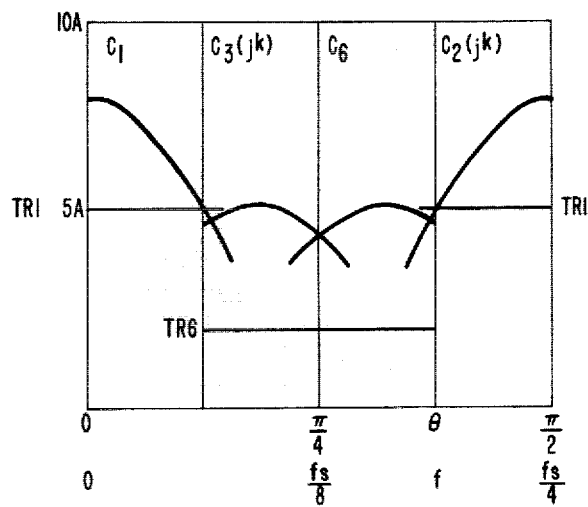
FIG. 8 is an isolated view of the band from 0 to $f_s/4$ as shown in FIG. 4 depicting the placement of the decision thresholds TR1 and TR6.

To understand how a tone can be isolated and detected by processing which consecutive stages of decimation, the steps in processing a tone of frequency $f_0$ are now considered. For the tone initially sampled at a rate of $f_s$ Hz, spectral lines occur in the digital spectrum at $\pm f_0$, $\pm f_s \pm f_0$, $\pm f_s \pm 2f_0$, and so forth. The sampling rate is chosen so that the tone falls within the quadrate 0 to $f_s/4$ Hz ($0 < f_0 < f_s/4$); thus the tone may be unambiguously determined to fall within one of the subbands or cells (0, $f_s/16$), ($f_s/16$, $f_s/8$), ($f_s/8$, $3f_s/16$) or ($3f_s/16$, $f_s/4$) by processing the outputs from the filter array or bank $C_1$, $C_3(j^k)$, $C_6$, $C_2(j^k)$. This is basically accomplished by comparing each filter output to a threshold, as depicted in FIG. 8. Threshold TR1 applies to both filters $C_1$ and $C_2(j^k)$ and is obtained by evaluating equation (9) for $\theta = \pi/8$. A convenient choice of threshold TR6 is one-half the value of equations (11) or (12) evaluated for $\theta = 3\pi/4$, and applies to filter pairs $C_3(j^k)$ and $C_6$. In addition, with respect to the latter filter pairs, once TR6 has been exceeded by either or both outputs, a comparison between the outputs of $C_3(j^k)$ and $C_6$ determines the larger output and hence the cell containing the tone.

If the tone samples are now decimated by a factor of four, that is, only every fourth sample value from the original set of samples is retained, then spectral lines appear at $\pm f_0$, $\pm f_s/4 \pm f_0$; $\pm f_2/4 \pm 2f_0$, and so forth. By selecting the 4:1 ratio between initial sample rate and reduced sample rate and by selecting cell widths of $f_s/16$ for the first stage of sampling, no additional spectral components fall within the original subband containing baseband spectral lines $\pm f_0$. This is true even though aliasing occurs because the judicious selection of cell width and reduced sample rate precludes aliased spectral lines from appearing in the subband containing the spectral line of interest.

The process described with respect to the decimation by a factor of four may continue until the desired resolution (final cell width) is achieved. In FIGS. 4, 6 and 7, three stages of processing are exemplified. The tone will thus be resolved to a cell of width $f_s/256$.

3. Illustrative Embodiment

Figure 9:
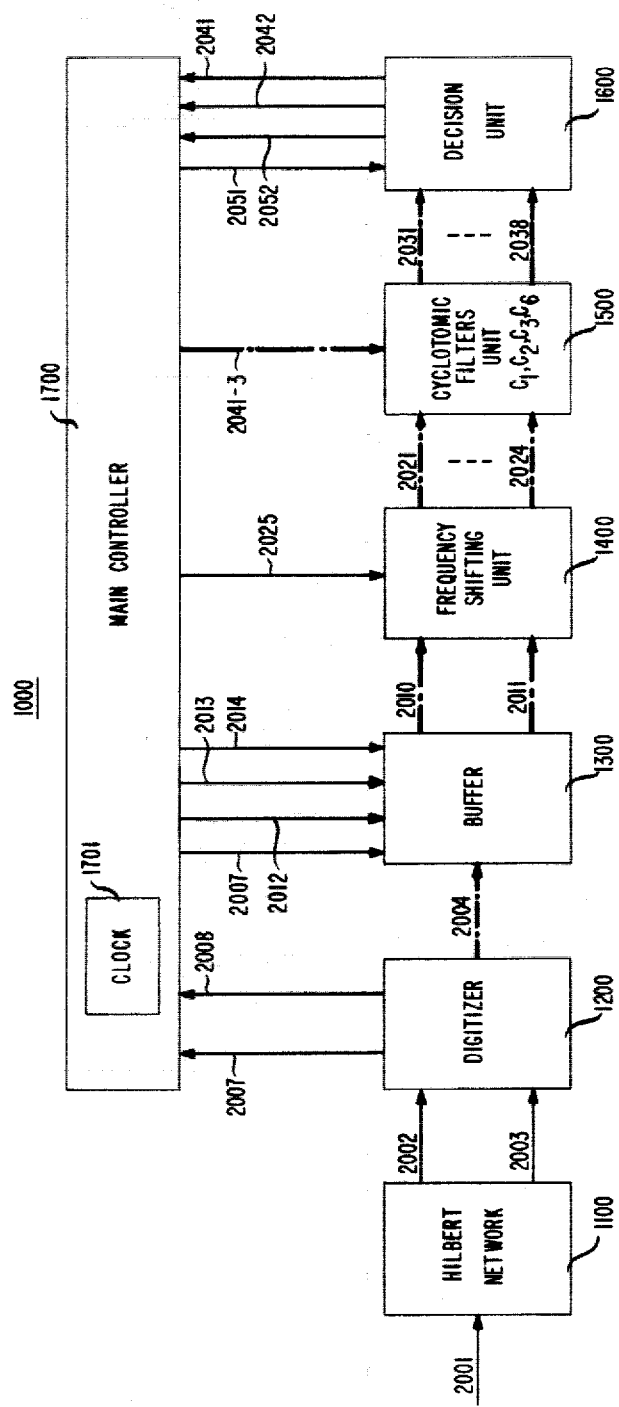
FIG. 9 is a block diagram of a complete embodiment of a cyclotomic tone detecting system in accordance with the present invention.

An illustrative implementation of a complete cyclotomic tone detection system incorporating pairs of filters $C_1$, $C_2$, $C_3$ and $C_6$ is shown in block diagram form in FIG. 9. The system (designated 1000) in accordance with the present invention generally comprises the following seven interrelated subsystems: Hilbert network 1100; digitizer 1200; buffer 1300; frequency shifting unit 1400; cyclotomic filters unit 1500; decision unit 1600; and main controller 1700. Elements 1100 through 1600 are connected in cascade, whereas controller 1700 serves as the primary source for generating control signals as well as an interface for feeding forward and feeding back secondary control singals from elements 1200 through 1600.

Hilbert network 1100 is a $\pi/2$ phase-shifting network designed to process the analog tone appearing on lead 2001; this tone is represented by $A\cos(2\pi ft + \phi)$. The outputs from network 1100 have the following form: $A\cos(2\pi ft + \phi_1)$ and $A\sin(2\pi ft + \phi_1)$; these analog signals appear on leads 2002 and 2003, respectively. The new phase $\phi_1$ is also randomly distributed over $(0, 2\pi)$. In the description that follows, it is convenient to refer to the signal $A\cos(2\pi ft + \phi_1)$ as the in-phase or real tone, whereas $A\sin(2\pi ft + \phi_1)$ is called the quadrature or the imaginary tone. Moreover, the frequency f is presumed to lie within the range from 100 Hz to 10 kHz.

Figure 10:
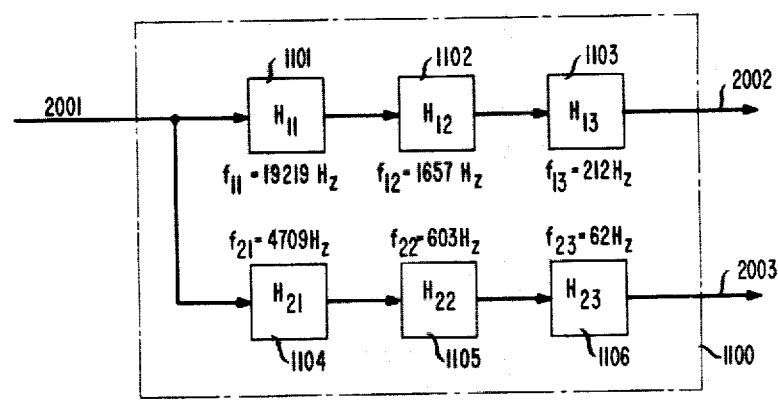
FIG. 10 is a block diagram representation of the Hilbert network of FIG. 9.

FIG. 10 discloses one design for Hilbert network 1100 which ensures that the real and imaginary tones are within about 1.5 degrees of the required 90 degree phase difference between them over the band from 100 Hz to 10 kHz. The tone on lead 2001 is processed in the upper branch of network 1100 by the cascade of three networks designated 1101, 1102 and 1103. Each of these three networks has the topology shown in FIG. 11. The transfer function relating the voltage on lead 1111 to the voltage on lead 1110 is given by $$H_{ij}(s) = \frac{1 - s\tau_{ij}}{1 + s\tau_{ij}}$$

where $$\tau_{ij} = \frac{1}{2\pi f_{ij}} = R_{ij}C_{ij}$$

The values of $f_{ij}$ for each network $H_{ij}$, as shown in FIG. 10 are: $f_{11} = 19,219$ Hz; $f_{12} = 1657$ Hz; and $f_{13} = 212$ Hz.

Figure 11:
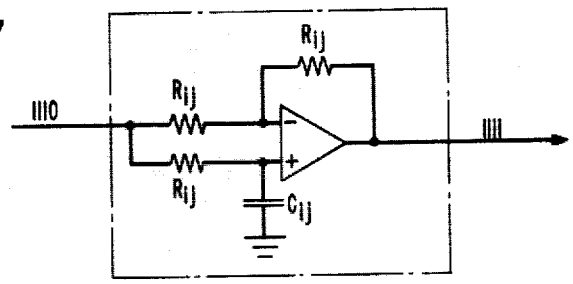
FIG. 11 is a circuit diagram indicating one form of the all-pass elements shown in FIG. 10.

The bottom branch in FIG. 10, comprising the cascade of networks 1104, 1105 and 1106, processes the tone on lead 2001 to yield the quadrature tone appearing on lead 2003. Again the topology of each of these networks is shown in FIG. 11. The values of $f_{ij}$ for each network $H_{ij}$, again as depicted in FIG. 10, are: $f_{21} = 4709$ Hz; $f_{22} = 603$ Hz; and $f_{23} = 62$ Hz.

Digitizer 1200 receives the real and imaginary analog tones from Hilbert network 1100 and samples these tones to obtain discretized versions of the two analog signals. The sampled signals may be either sampled data signals (discretized time) or digital signals (discretized time and amplitude).

Figure 12:
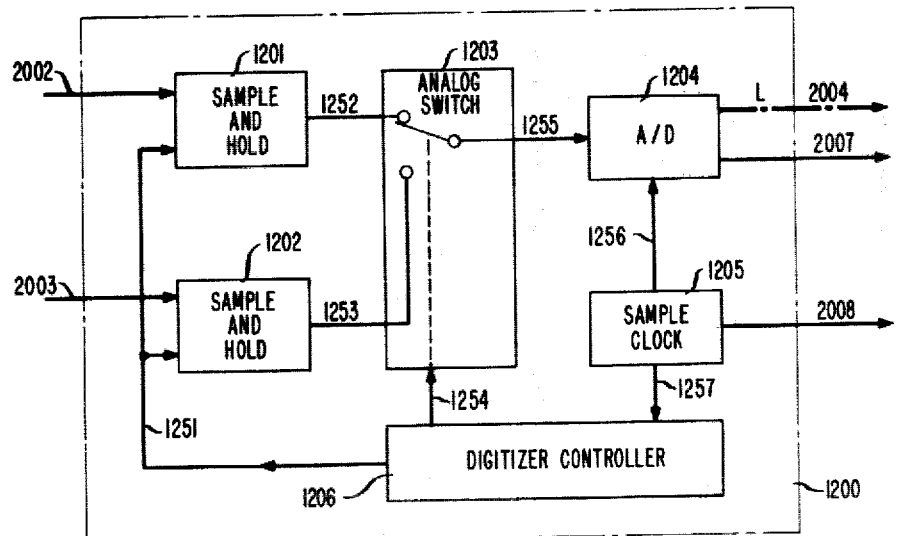
FIG. 12 is a block diagram of one form of the digitizer unit in FIG. 9.

For the digital case, FIG. 12 depicts an illustrative embodiment of digitizer 1200 in block diagram form. The purpose of this embodiment is to convert the real and imaginary tones into L-bit data words using only a single analog-to-digital (A/D) converter. The real and imaginary components on leads 2002 and 2003, respectively, are simultaneously sampled and held by devices 1201 and 1202, respectively. Digitizer controller 1206, via lead 1251, switches devices 1201 and 1202 between sample and hold states at the appropriate time instants. During a hold interval, analog switch 1203, as directed by controller 1206 via lead 1254, alternately switches between leads 1252 and 1253 to supply A/D converter 1204, via lead 1255, with the real and imaginary sampled data signals. Two L-bit words representing the digital versions of the analog signals appear sequentially on channel 2004, which has L parallel leads to transmit each L-bit word. The first word in the sequence corresponds to the real input tone whereas the second word corresponds to the imaginary tone. Lead 2007 provides a signal to main controller 1700 indicating that digitizing is complete and that the two output words, on channel 2004, are available for further processing. Sample clock 1205 provides timing information to controller 1206 and converter 1204 via leads 1257 and 1256, respectively. In addition, clock 1205 feeds forward a synchronizing signal to controller 1700, via lead 2008, to insure overall system synchronization. For an input tone in the range from 100 Hz to 10 kHz, the frequency of clock 1205 is at least 40 kHz.

Figure 13:
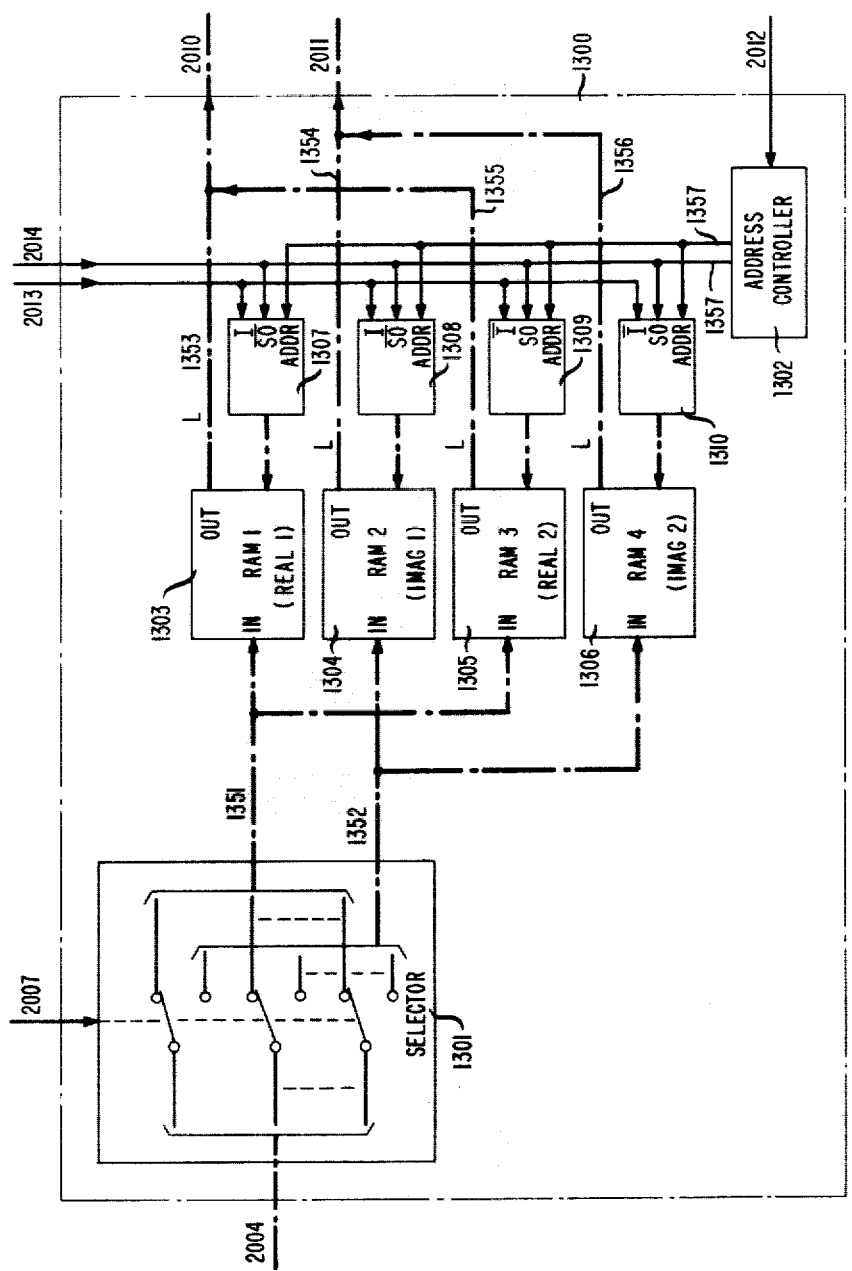
FIG. 13 is a block diagram of one form of the buffer device in FIG. 9.

Buffer 1300 comprises two essentially identical storage arrangements. While one arrangement provides input information to the remaining stages, the other storage arrangement is being loaded, and vice versa. FIG. 13 depicts, in block diagram form, an illustrative embodiment of buffer 1300. Random access memory (RAM) element 1303 and RAM controller 1307, as well as companion RAM element 1304 and RAM controller 1308 form one storage arrangement. The other storage arrangement comprises RAM devices 1305 and 1306 and associated controllers 1309 and 1310. RAM elements 1303 through 1306 utilize M-by-L bit memories where M is related to the number of samples processed by the filter (N) and the number of decimation stages (D). In the above overview description, three decimation stages, each reducing sampling by a factor of four, were illustrated for the case of cyclotomic filters processing groups of eight samples. Therefore $M \geq 1 + (8-1)4^{3-1} = 113$; in general $M \geq 1 + (N-1)4^{D-1}$. In practice, a standard, commercially available random access memory device is utilized for elements 1303 through 1306; in this case, say for L=4 bits, a 128×4-bit word memory is a convenient selection. A total time of about (113/40 kHz) milliseconds is needed to sample and store the digitized signals in each storage arrangement.

Selector 1301 in FIG. 13, in response to A/D converter 1204 (see FIG. 12) via lead 2007, alternately directs real and imaginary samples to the proper storage devices. For instance, a signal on enable lead 2013, supplied by main controller 1700, indicates which memory pair, 1303,1304 or 1305,1306, is enabled to accept samples arriving on channel 2004. The enable signal is provided by selection logic within RAM controllers 1307 through 1310; controllers 1307 and 1308 are phased-reversed with respect to controllers 1309 and 1310. RAM devices 1303 and 1305, both connected to selector 1301 via channel 1351 comprising L leads, and devices 1304 and 1306, connected to selector 1301 via channel 1352 having L leads, are alternately connected to channel 2004 through selector 1301. If memory pair 1303,1304 is enabled to accept samples, the samples appearing on channels 1351 and 1352 are directed to the proper storage locations in memory pair 1303,1304.

For convenience in discussing particular samples, the first sample is denoted "0" and is presumed to be stored at memory location 0; the next sample, "1," is stored at location 1, and so forth. Moreover, (0,1,2,3,4,5,6,7) designates an array of samples comprising the first eight samples serially emitted from any output channel 1353 through 1356, each of which comprises L leads in parallel. Similarly, (0,4,8,12,16,24,28) designates a serially ordered and emitted array of length eight formed by selecting every fourth sample. Finally, (0,16,32,64,80,96,112) designates an array of length eight formed by including every sixteenth sample. These are the arrays processed by cyclotomic filters unit at each stage of decimation. The arrays are supplied by buffer 1300 during appropriate time intervals with the aid of address controller 1302. The signal supplied by main controller 1700 on channel 2012 indicates the stage of decimation; for three stages, the indicator would be either 1, 2 or 3 in appropriately coded format (e.g., binary: 01, 10, 11). If the indication is that stage one is operational, address controller 1302 generates an address array to direct, via lead 1357, RAM controllers 1307 through 1310 to sequentially select samples "0," "1," ..., "7." The shift-out signal appearing on lead 2014, as provided by main controller 1700, causes the data to be shifted from the proper memory pair in sequential fashion. For example, if memory pair 1303,1304 has an input disable on lead 2013, then: the first shift-out signal on lead 2014 causes sample "0" of the real tone to appear on channel 1353 simultaneously with the appearance of sample "0" of the imaginary tone on channel 1354; the next shift-out signal outputs sample "1" of the real and imaginary tones to channels 1353 and 1354, respectively. This process continues until the eight samples have been read out.

If the indication on lead 2012 is that decimation stage two is operational, then the sequential shift-out signals on lead 2014 cause the real and imaginary "0" samples to appear on channels 1353 and 1354, respectively, followed by the "4" samples, and so forth. A state three indication causes the sequence of samples "0," "16," and so forth.

The appropriate real and imaginary samples appear sequentially on channels 2010 and 2011, respectively. Channel 2010 is formed by bridging real output channels 1353 and 1355, whereas channels 1354 and 1356 from the imaginary memory pair 1304,1306 are connected to form channel 2011.

Figure 14:
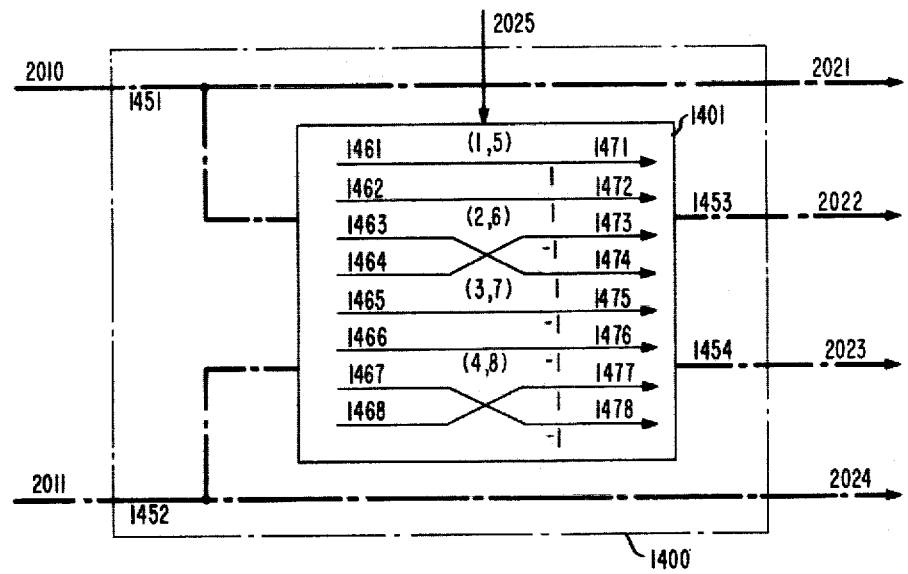
FIG. 14 is a schematic diagram of one form of the frequency-shifting unit from FIG. 9.

Frequency shifting unit 1400 effects modulus-one multiplication. FIG. 14 depicts an embodiment of a modulus-one multiplier in block diagram form. The multiplication is accomplished basically by interchanging real (in-phase) and imaginery (quadrature) data words, when required, and changing sign, also when required. Element 1401 accomplishes the interchanging and multiplication under control of main controller 1700, via lead 2025, which provides the signal indicating the sample number (1 through 8) to be processed. The inputs to element 1401 are the real and imaginary data words arriving on channels 2010 and 2011, respectively.

Although channels 2010 or 2011 comprise L parallel leads, for the sake of clarity, channels 2010 and 2011 are represented by single lines 1451 and 1452 in FIG. 14. Similarly, output channels 2021 through 2024, while comprising L parallel leads, are represented by lines 1451, 1453, 1454 and 1452, respectively. The operation of element 1401 on a sample-by-sample basis is summarized by the following interconnection table:

| Sample Number (lead 2025) | 1451 | 1452 | 1453 | 1454 |
|---|---|---|---|---|
| | | (connect to) | | |
| 1 | 1461 | 1462 | 1471 | 1472 |
| 2 | 1463 | 1464 | 1473 | 1474 |
| 3 | 1465 | 1466 | 1475 | 1476 |
| 4 | 1467 | 1468 | 1477 | 1478 |
| 5 | 1461 | 1462 | 1471 | 1472 |
| 6 | 1463 | 1464 | 1473 | 1474 |
| 7 | 1465 | 1466 | 1475 | 1476 |
| 8 | 1467 | 1468 | 1477 | 1478 |

Moreover, as depicted in FIG. 14, the signal on line 1471 is the same as the signal on line 1461, the signal on lead 1473 is the negative of the signal on lead 1464, and so forth. Thus, the words appearing sequentially on line pair 1453,1454 correspond to frequency-shifted versions of the real and imaginary words appearing on line 1451,1452.

Figure 15:
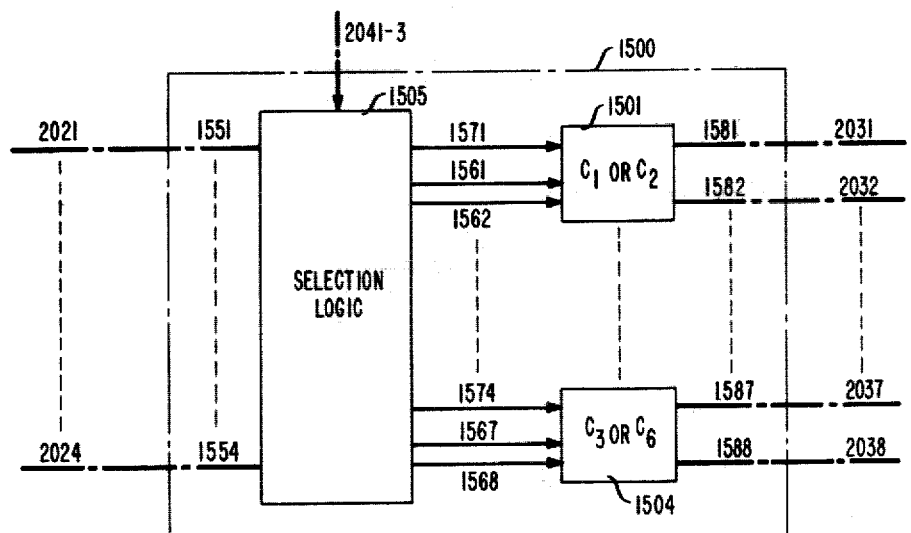
FIG. 15 is a block diagram of the cyclotomic filters unit shown in FIG. 9.

An illustrative embodiment of cyclotomic filters unit 1500 is shown in block diagram form in FIG. 15. Four pairs of filters are required for each decimation stage. In FIG. 15, filter elements 1501 through 1504 depict each pair of filters. In each element 1501 through 1504, one filter processes the real data words whereas the companion filter processes the associated imaginary data words. Moreover, elements 1501 and 1502 can be configured to operate as either a $C_1$ filter pair or as a $C_2$ filter pair in response to the configuration signals present on leads 1571 and 1572, respectively. Similarly, elements 1503 and 1504 may function as either a $C_3$ filter pair or a $C_6$ filter pair under control of signals on leads 1573 and 1574, respectively. The signals appearing on leads 2041 and 2042, as provided by the main controller 1700, indicate the part of the frequency spectrum that is to be searched during the present processing stage. This information is supplied to controller 1700 from results generated by decision unit 1600 during the immediately preceding decimation stage. The signal on lead 2043, also provided by controller 1700, indicates the number of the decimation stage undergoing processing.

Selection logic 1505, based on the present stage number on lead 2043 and frequency spectrum information arriving on leads 2041 and 2042, interconnects appropriate input channels 1551 through 1554 to intermediate channels 1561 through 1568. Again, although channels 1551 through 1554 and channels 1561 through 1568 comprise L-bit leads, they are shown as single lines in FIG. 15. Line pair 1551,1554 has the real and imaginary words whereas line pair 1552,1553 supplies the frequency shifted versions of the real and imaginary words. The following tables summarize the input-output relations for selection logic 1505. In the tables, leads 2041 and 2042 are presumed to supply logic states 0 or 1 whereas lead 2043 can take on the values of 1, 2 or 3.

| | STAGE 1 | | | |
|---|---|---|---|---|
| Element | 1501 | 1502 | 1503 | 1504 |

-continued

| Configured as | $C_1$ | $C_2$ | $C_3$ | $C_6$ |
|---|---|---|---|---|
| Channel | 1561,1562 | 1563,1564 | 1565,1566 | 1567,1568 |
| Connects to | 1551,1554 | 1552,1553 | 1552,1553 | 1551,1554 |

STAGES 2 AND 3

| Element | 1501 | 1502 | 1503 | 1504 |
|---|---|---|---|---|
| Configured as | | | | |
| 2041  2042 | | | | |
| 0  0 | $C_1$ | $C_2$ | $C_3$ | $C_6$ |
| 0  1 | $C_2$ | $C_2$ | $C_3$ | $C_3$ |
| 1  0 | $C_1$ | $C_2$ | $C_3$ | $C_6$ |
| 1  1 | $C_1$ | $C_1$ | $C_6$ | $C_6$ |
| Channel | 1561,1562 | 1563,1564 | 1565,1566 | 1567,1568 |
| Connects to | | | | |
| 2041  2042 | | | | |
| 0  0 | 1551,1554 | 1552,1553 | 1552,1553 | 1551,1554 |
| 0  1 | 1551,1554 | 1552,1553 | 1551,1554 | 1552,1553 |
| 1  0 | 1552,1553 | 1551,1554 | 1551,1554 | 1552,1553 |
| 1  1 | 1551,1554 | 1552,1553 | 1551,1554 | 1552,1553 |

Decision unit 1600 has a two-fold purpose: (i) forming the modulus of each real-imaginary pair present on the four channel pairs (2031,2032), . . . , (2037,2038); and (ii) determining, at each stage, in which of the four filters the tone is detected. An illustrative embodiment of decision unit 1600 is shown partly in schematic and partially in block form, in the diagram of FIG. 16. Again for clarity of exposition, channels 2031 through 2038 are shown as single lines 1651 through 1658. Each element 1601 through 1604 forms the modulus of the real-imaginary pair appearing at its input. The modulus is generated only after the processing of eight contiguous samples has been completed; lead 2051 from controller 1700 provides the signal to initiate modulus generation. For example, when lead 2051 indicates a modulus computation is required, the words on lines 1651 and 1652 are squared within element 1601 and, additionally, the square root of the sum of the squared components is generated. The result of these mathematical operations on the signals appears on lead 1661. This signal corresponds to the first filter position, that is, the first quadrant. Similarly, the signals appearing on leads 1662, 1663 and 1664 correspond to the fourth, second and third filter subbands or quadrants, respectively. Although the preceding discussion has focused on obtaining the modulus of each output, it is clear that the square of the modulus or even an approximation to the modulus is an appropriate signal to supply the comparator stages (to be discussed presently). Only the threshold levels, provided for comparison purposes, need be adjusted in accordance with the signal supplied to the comparators. An example of a useful approximation to the modulus is the linear one given by $$\text{Max}(|x_n|,|y_n|) + a\text{Min}(|x_n|,|y_n|),$$

where $x_n$ and $y_n$ are the $n^{th}$ elements of the inphase (real) and quadrature (imaginary) sequences produced by a filter pair, the operators denoted "Max" and "Min" detect the maximum and minimum, respectively, from the set of sample values $(x_n,y_n)$, and a is a scalar multiplier.

In a binary system, a is typically $\frac{1}{4}$ so that multiplication by a corresponds to two shift operations.

The signals on leads 1661 and 1662 are compared to threshold TR1, which appears on lead 1665, in comparators 1605 and 1606, respectively. The threshold value TR1 is obtained by evaluating $|z(C_1,n,\theta)|$ for $\theta=\pi/8$ and is given by, in general, for any N where N is the number of samples processed:

$$A \left| \frac{\sin \frac{N\pi}{16}}{\sin \frac{\pi}{16}} \right|.$$

The signals on leads 1663 and 1664 are compared to threshold TR6, which appears on lead 1666, in comparators 1607 and 1608, respectively. The threshold value TR6 is obtained by evaluating $\frac{1}{2} z(C_6,m,\theta)$ for $\theta=\pi/4$ and is given, in general, for any N by:

$$A \left| \sin \frac{5\pi}{8} \cdot \frac{\sin\left(3m\left(\frac{5\pi}{8}\right)\right)}{\sin \frac{15\pi}{8}} \right|$$

for $N = 3m$ or $N = 3m+1$, $m = 1, 2, \ldots$; or $$A \left| e^{-j(3m-4)5\pi/8} \cdot \frac{\sin \frac{5\pi}{8} \sin \frac{(3m-4)5\pi}{8}}{\sin \frac{15\pi}{8}} + 1 \right|$$

for $N = 3m-1$, $m = 1, 2, \ldots$.

Decision logic 1609 decodes the results of the comparisons in comparators 1605 through 1608. The decoding yields two bits of information at each stage indicating in which of the four quadrants the tone is detected. The decoded information appears on leads 2041 (most significant bit) and lead 2042. The decision logic for each stage of decimation is as follows: if the signal on lead 1661 is greater than TR1, then the tone lies in the first quandrant; if the signal on lead 1662 is greater than TR1, then the fourth quadrant is selected; if the signals on 1661 and 1662 are less than TR1, and the signal on lead 1663 is greater than both TR6 and the signal on lead 1664, then the second quadrant is chosen; otherwise, if the signal on lead 1664 is greater than both TR6 and the signal on lead 1663, the third quadrant is selected. Of course, if no signals are greater than the corresponding threshold, it is decided no signal is present and this indication is passed to controller 1700 via lead 2052. Other error conditions may also be tested in the logic of element 1609, including checking for two or more signals in excess of the corresponding threshold.

The result of the logic performed by element 1609 may be summarized by the following truth table at each stage:

| Lead | | 2041 | 2042 | Quadrant |
|---|---|---|---|---|
| Signal on: | 1671 | 0 | 0 | 1 |
| | 1672 | 1 | 1 | 4 |
| | 1673 | 0 | 1 | 2 |
| | 1674 | 1 | 0 | 3 |

As an example of sequential output signals generated on lead pair 2041,2042, it is supposed that the input tone is in the second quadrant of stage one. Then the output on pair 2041,2042 is (01). If the tone is in the first quadrant during stage two, then (00) appears on pair 2041,2042. Finally, if the tone falls within the fourth quadrant during stage three, (11) obtains. The array (01,00,11) formed by grouping sequential outputs from pair 2041,2042 is decoded in main controller 1700 at the completion of the last stage of decimation.

Main controller 1700 of FIG. 9 provides overall system timing, via master clock 1701, and any additional control signals required by subsystems 1300 through 1600. Moreover, controller 1700 conveniently provides feed forward and feedback paths to communicate signals generated by or for subsystems 1200 through 1600. Each of these signals has been discussed in the foregoing description of each related subsystem and therefore requires no additional elaboration. Finally, controller 1700 stores, decodes and, when required, indicates the subband location of the tone after the completion of the successive stages of decimation.

With respect to timing, master clock 1701 generally operates at a rate greater than or equal to sampling clock 1205 (see FIG. 12). Oftentimes, however, to utilize system hardware more effectively, some subsystem components may be operated in a time-shared mode. For example, one pair of cyclotomic filters, or even one cyclotomic filter, may be time-shared during processing. Consequently, master clock 1701 will operate at a rate significantly greater than the rate of clock 1205.

Controller 1700 may also be structured to increase detection capability by employing statistical averaging. One way to accomplish this is, at each stage of decimation, to repeat the filter processing a number of times before advancing to the next stage of decimation. Each repetition processes a different set of samples. The required sample sets may be provided by increasing the size of the storage in buffer 1300. A simple algorithm is to repeat each stage an odd number of times and use a majority rule. Another way to take advantage of statistical averaging is to repeat a number of iterations of the three-stage decimation process with or without stage-by-stage averaging. Controller 1700 is then adapted to control the desired number of repetitions.

It is to be understood that the cyclotomic tone detection system, and associated methodology, described herein is not limited to specific forms disclosed by way of example and illustration, but may assume other embodiments limited only by the scope of the appended claims.

We claim:

1. A frequency measuring system for detecting and estimating the frequency of an analog tone characterized by means (1100) for receiving and transforming said tone to obtain both a real tone corresponding to a phase-shifted version of said tone and an imaginary tone corresponding to the quadrature of said real tone;

means (1200), responsive to said means for transforming, for sampling said real tone and said imaginary tone to provide a sequence of real and imaginary word pairs;

buffer means (1300), coupled to said means for sampling, for storing a plurality of said word pairs;

modulus-one means (1400), connected to said buffer means, for generating frequency-shifted real words and imaginary words from selected ones of said word pairs;

digital filter means (1500), responsive to said modulus-one means and said buffer means, comprising two pairs of first-order cyclotomic filters (1501,1502) and two pairs of second-order cyclotomic filters (1503,1504), with one filter from each of said pairs arranged to process real words and the other arranged to process imaginary words, each of said pairs producing a real output and an imaginary output; and decision means (1600), responsive to said filter means, for processing said real output and said imaginary output of each of said pairs of filters and indicating the appropriate frequency subband containing said tone based on predetermined relationships involving each said output.

2. Circuitry as recited in claim 1 wherein said means for processing includes means (1601–1604) for generating the magnitude corresponding to each said real output and each said imaginary output of said pairs and said predetermined relationships are expressed in terms of each said magnitude.

3. Circuitry as recited in claim 2 wherein each said magnitude is obtained from the linear approximation Max $(|x_n|,|y_n|)+b\text{Min}(|x_n|,|y_n|)$ where $x_n$ and $y_n$ are the $n^{th}$ sequence elements corresponding to each said real output and each said imaginary output, respectively, of each said pairs and b is a scalar multiplier.

4. Detection circuitry for determining if an input signal includes a tone within one of four bands, said circuitry comprising:

means (1100) for receiving and Hilbert transforming said input signal to obtain the Hilbert signal;

means (1200), responsive to said input signal and said means for transforming, for separately sampling said input signal and said Hilbert signal to obtain a sampled input signal and a sampled Hilbert signal;

digital filter means (1500), coupled to said means for sampling, including a first digital filter pair (1501), each filter having substantially identical characteristics represented by the first order cyclotomic polynomial $C_1(\lambda) = \lambda - 1$, one of said first pair responsive to said sampled input signal and the other responsive to said sampled Hilbert signal, a second digital filter pair (1503), each filter having substantially identical characteristics represented by the second order cyclotomic polynomial $C_6 = \lambda^2 - \lambda + 1$, one of said second pair responsive to said sampled input signal and the other responsive to said sampled Hilbert signal, a third digital filter pair (1504), each filter having substantially identical characteristics represented by the second-order cyclotomic polynomial $C_3(\lambda) = \lambda^2 + \lambda + 1$, a fourth digital filter pair (1502), each filter having substantially identical characteristics represented by the first-order cyclotomic polynomial $C_2(\lambda) = \lambda + 1$, and modulus-one multiplier means (1400) for interconnecting said sampled input signal to one filter from said third and fourth pairs, and for interconnecting said sampled Hilbert signal to the other of said third and fourth pairs;

means (1601–1604), responsive to said filter means after a predetermined number of sample operations, for generating separate moduli corresponding to the respective outputs of said first pair, said second pair, said third pair, and said fourth pair; and detector means (1609), responsive to said means for generating, for comparing each of said moduli to a preselected threshold (1665 or 1666) and for indicating the presence of said tone in the appropriate one of said bands whenever said threshold is exceeded.

5. A frequency-measuring system for detecting and estimating the frequency of a continuous tone input characterized by
   means (1100) for receiving and transforming said tone input to simultaneously obtain both a real tone corresponding to a phase-shifted version of said tone input and an imaginary tone corresponding to the Hilbert transform of said real tone;
   means (1200), responsive to said means for transforming, for sampling said real tone and said imaginary tone to provide a sequence of real and imaginary words grouped as word pairs;
   buffer means (1300) responsive to said means for sampling comprising:
      two essentially identical storage arrangements (1303,1304,1307,1308 or 1305,1306,1309,1310), each of said arrangements including random access storage means (1303-1306) for storing a plurality of said word pairs and memory controllers (1307,1308 or 1309,1310) for enabling said storage means to receive said word pairs;
      an address controller (1302), coupled to said memory controllers, for controlling the alternate gating of blocks of said words from said each of said arrangements to provide said word pairs sequentially to the output of said buffer means; and
      means (1301), interposed between said arrangements and said means for sampling, for alternately selecting and then connecting one of said arrangements to said means for sampling for a preselected number of operations of said means for sampling,
   modulus-one frequency-shifting means (1400), responsive to said buffer means, including means 1401 for receiving said real and imaginary word pairs and generating
      (i) positively-shifted real words by providing outputs from said frequency-shifting means according to the pattern: the first real word from said pairs; the negative of the second imaginary word from said pairs; the negative of the third real word; the fourth imaginary word, said pattern continuing, with a period of four, for said preselected number of operations, and
      (ii) positively-shifted imaginary words by providing outputs from said frequency-shifting means according to the pattern: the first imaginary word from said pairs; the second real word from said pairs; the negative of the third imaginary word; the negative of the fourth real word, said pattern continuing, with a period of four, for said preselected number of operations,
   digital filter means (1500) comprising:
      a bank of four pairs of cyclotomic filters (1501-1504), two of said four pairs adapted for configuration as real, first-order filters, and the remaining two adapted for configuration as real, second-order filters, with one filter from each of said pairs arranged to process real words and the other to process imaginary words; and
      selection logic means (1505), interposed between said bank and said frequency-shifting means, for providing each of said filters with an appropriate sequence of words from said frequency-shifting means,
   decision means (1600), responsive to said bank, comprising:
      means (1601-1604) for generating the modulus of the output of each of said four pairs of filters;
      means (1605-1608) for comparing each said modulus to one threshold from a set of thresholds after said preselected number of samples have been processed; and
      decision logic means (1609) for indicating the appropriate spectral subband containing said tone based on predetermined relationships among the outputs from said means for comparing, and
   main controller means (1700) comprising:
      means (1701) for controlling decimation;
      means for operating said address controller to provide said blocks in response to said means for controlling decimation;
      means for driving said selection means to supply said appropriate sequence of words in response to said means for controlling decimation and said spectral subband determined from said outputs of said means for comparing; and
      means for configuring said filter means in response to said means for controlling decimation and said spectral subband.

6. The system as recited in claim 5 wherein said digital filter means and said selector means are arranged to provide filter responses, on successive stages of decimation by factors of 4, according to the following pattern:
   during the first stage of decimation, said bank is arranged as filters $C_1$, $C_3(j^k)$, $C_6$, $C_2(j^k)$,
   during the second stage of decimation, said bank is arranged as one of the following four sets: $\{C_1, C_3(j^k), C_6, C_2(j^k)\}$; $\{C_2(j^k), C_3, C_3(j^k), C_2\}$; $\{C_2, C_6(j^k), C_3, C_1(j^k)\}$; $\{C_1(j^k), C_6, C_6(j^k), C_1\}$, depending on the location of said tone within filter $C_1$, $C_3(j^k)$, $C_6$ or $C_2(j^k)$, respectively, after the first stage of decimation,
   during the third and succeeding stages of decimation, each group of four frequency subbands covered by the preceding stage is covered by the union of said four sets.

7. The system as recited in claim 5 wherein the modulus of the first through fourth of said filters is representative of the strength of said tone input appearing, respectively, in the first, fourth, second and third quarters of said subband, and
   said predetermined relationships provide an indication of the presence of said tone in the quarter of said subband corresponding to the associated modulus whenever:
      said first modulus is greater than a first threshold from said set of thresholds;
      said first modulus is less than said first threshold and said fourth modulus is greater than said first threshold;
      both said first modulus and said fourth modulus are less than said first thresholds and said second modulus is greater than a second threshold from said set of thresholds and said third modulus; and
      both said first modulus and said fourth modulus are less than said first threshold and said third modulus is greater than said second threshold and said second modulus.

* * * * *